United States Patent [19]

Kudo

[11] Patent Number: 5,745,294
[45] Date of Patent: Apr. 28, 1998

[54] ILLUMINATING OPTICAL APPARATUS

[75] Inventor: Yuji Kudo, Kawasaki, Japan

[73] Assignee: Nikon Corporation, Tokyo, Japan

[21] Appl. No.: 609,180

[22] Filed: Mar. 1, 1996

Related U.S. Application Data

[63] Continuation of Ser. No. 154,548, Nov. 19, 1993, abandoned.

[30] Foreign Application Priority Data

Nov. 24, 1992 [JP] Japan .................. 4-312545
May 31, 1993 [JP] Japan .................. 5-128642

[51] Int. Cl.$^6$ .................. G02B 27/10; F21V 29/00; F21V 7/00
[52] U.S. Cl. .................. 359/618; 362/268; 362/347; 362/350
[58] Field of Search .................. 359/618, 619, 359/620, 621, 622, 623, 624; 362/32, 35, 259, 268, 170, 347, 350; 355/67, 71, 78

[56] References Cited

U.S. PATENT DOCUMENTS

| Re. 34,634 | 6/1994 | Konno | 362/268 |
| 4,497,015 | 1/1985 | Konno | 362/268 |
| 4,683,524 | 7/1987 | Ohta | 362/268 |
| 4,744,615 | 5/1988 | Fan et al. | 350/96 |
| 4,851,882 | 7/1989 | Takahashi | 355/46 |
| 4,851,978 | 7/1989 | Ichihara | 362/268 |
| 4,918,583 | 4/1990 | Kudo | 362/268 |
| 4,931,830 | 6/1990 | Suwa | 355/71 |
| 4,947,030 | 8/1990 | Takahashi | 250/201.1 |
| 4,970,546 | 11/1990 | Suzuki | 355/53 |
| 4,988,188 | 1/1991 | Ohta | 353/122 |
| 5,245,384 | 9/1993 | Mori | 355/67 |
| 5,311,362 | 5/1994 | Matsumoto | 359/738 |
| 5,335,044 | 8/1994 | Shiraishi | 355/53 |
| 5,379,090 | 1/1995 | Shiraishi | 355/67 |
| 5,459,547 | 10/1995 | Shiozawa | 355/67 |

FOREIGN PATENT DOCUMENTS 61-91662 5/1986 Japan.
4-101148 4/1992 Japan.

*Primary Examiner*—Georgia Y. Epps
*Assistant Examiner*—Ricky Mack
*Attorney, Agent, or Firm*—Shapiro and Shapiro

[57] ABSTRACT

An illuminating optical apparatus comprises a light source providing a light beam; a rotationally symmetrical mirror having an aperture of a predetermined shape; a collimating optical system for converting the light beam, coming from the light source and condensed by the rotationally symmetrical mirror, into a substantially parallel light beam; a multiple light source forming device for forming plural secondary light sources by said substantially parallel light beam; and a condenser optical system for condensing the light beam from the multiple light source forming device, thereby uniformly illuminating an object of illumination. The collimating optical system is adapted to form an image of the reflecting surface of the rotationally symmetrical mirror on a predetermined plane of the multiple light source forming device.

32 Claims, 9 Drawing Sheets

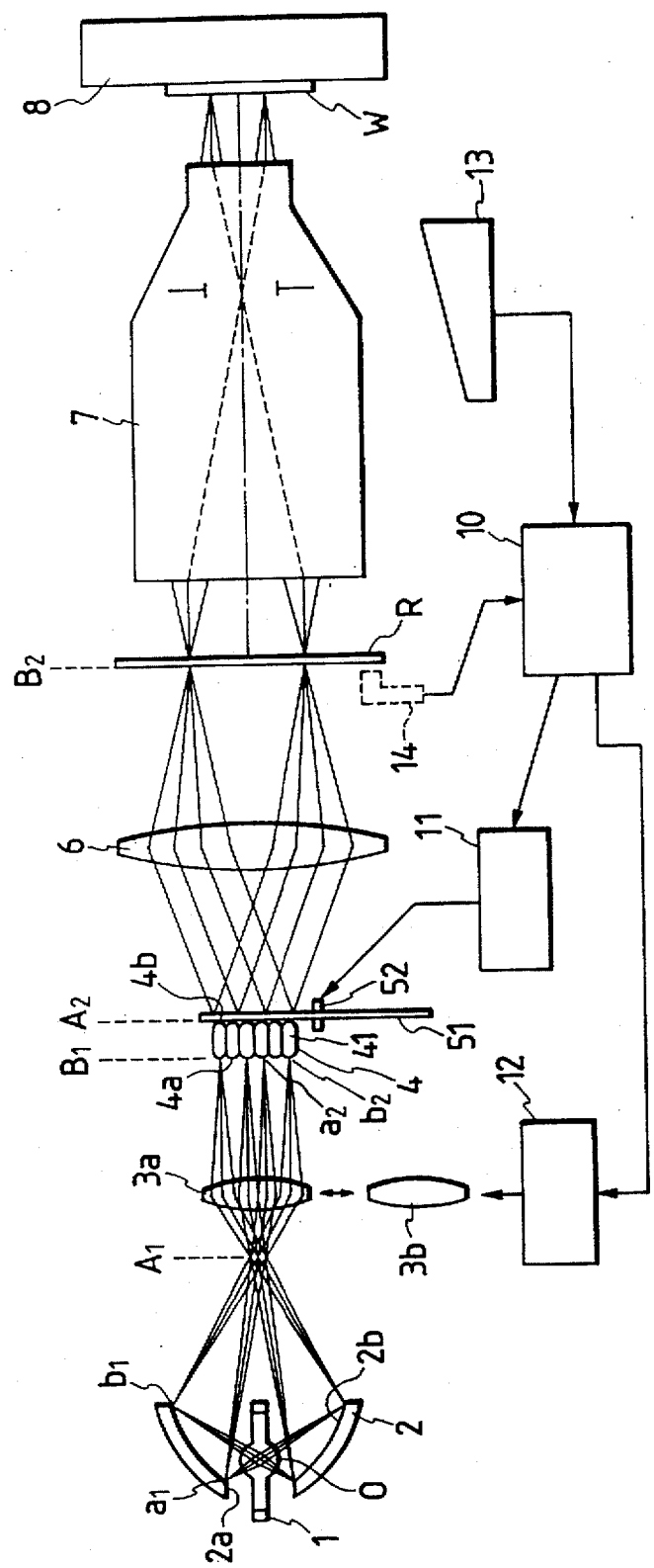

ILLUMINATING OPTICAL APPARATUS

This is a continuation of application Ser. No. 08/154,548 filed Nov. 19, 1993, now abandoned.

BACKGROUND OF THE INVENTION

1. Field of the Invention

The present invention relates to an illuminating optical apparatus for uniformly illuminating a plane to be illuminated and more particularly to such illuminating optical apparatus adapted for use in an exposure apparatus for semiconductor device manufacture.

2. Related Background Art

Conventionally there is known, for example, an illuminating optical apparatus applied to a semiconductor exposure apparatus as illustrated in FIG. 12. As shown therein, the light beam from a light source 1 such as a mercury arc lamp is condensed by an elliptical mirror 2, then converted into a parallel light beam by a mirror M1 and a collimating lens 3, and guided to a fly's eye lens 4, whereby there is formed a secondary light source consisting of a plurality of secondary light source images. The light beams from said secondary light source pass through a diaphragm 5 and are condensed by a mirror M2 and a condenser lens 6 and uniformly illuminate, in superposed manner, a reticle R constituting the object to be illuminated.

The illuminating optical apparatus of the above-explained configuration projects the circuit pattern, formed on the reticle R, onto a wafer W placed on a wafer stage 8, in reduced size through a projection optical system 7.

In recent years, it is strongly desired to transfer a finer pattern onto the wafer, and, for this purpose there is; conceived an improvement in the resolving power of the projection optical system. Such improvement in the resolving power may be achieved by the use of a light source of a shorter wavelength, or by an increase in the numerical aperture of the projection optical system.

However, it is difficult to construct a projection optical system matching such light source of shorter wavelength, because of lack of suitable optical material usable as transmissive optical elements.

An increase in the numerical aperture decreases the depth of focus in proportion to the square of said numerical aperture. Thus the resolving power currently achieved by the projection optical system has reached its limit.

Under such situation, there has recently been proposed so-called oblique illumination technology, which illuminates the reticle R in oblique manner by deforming the shape of the secondary light source, formed at the exit side of the fly's eye lens as shown in FIG. 12, thereby achieving a resolving power and a depth of focus significantly better than those inherent to the projection optical system 7, and such technology is currently attracting great attention.

Among said technology, there is known, for example, the annular illumination method in which an annular (doughnut-shaped) aperture is formed in the diaphragm 5, provided at the exit side of the fly's eye lens as shown in FIG. 12, to form an annular secondary light source for obliquely illuminating the reticle R, thereby achieving improvements in the resolving power and in the depth of focus.

Also there is known, as disclosed in the Japanese Patent Laid-Open Application No. 4-101148, a special oblique illumination method in which the diaphragm 5 as shown in FIG. 12 is provided with two or four apertures to form two or four secondary light sources for oblique illumination of the reticle R, thereby achieving a finer resolution and a larger depth of focus than in the annular illumination method.

Although the above-explained oblique illumination technology can provide significant improvements in the resolving power and the depth of focus over those inherent to the projection optical system, it is associated with a drawback of significantly lowered illumination efficiency, because the light beam has to be considerably intercepted by the diaphragm provided at the exit side of the fly's eye lens in order to deform the secondary light source. This leads to a serious drawback of significant loss in the throughput.

SUMMARY OF THE INVENTION

In consideration of the foregoing, the present invention has been achieved to resolve all these drawbacks, and an object of the invention is to provide an illuminating optical apparatus capable of maintaining a high illumination efficiency with a simple configuration.

The above-mentioned object can be attained, according to an embodiment of the present invention, by an illuminating optical apparatus comprising a light source providing a light beam; a rotationally symmetrical mirror having an aperture of a predetermined shape; a collimating optical system for converting the light beam, coming from said light source and condensed by said rotationally symmetrical mirror, into a substantially parallel light beam; multiple light source forming means for forming plural secondary light sources by said substantially parallel light beam; and a condensing optical system for condensing the light beams from said multiple light source forming means for uniformly illuminating an illuminated object, wherein said collimating optical system is so constructed as to form the image of the reflecting surface of said rotationally symmetrical mirror on a predetermined plane of said multiple light source forming means.

According to another embodiment, the illuminating optical apparatus of the present invention comprises a light source providing a light beam; a rotationally symmetrical mirror having an aperture of a predetermined shape; a re-imaging optical system for re-imaging the image of the light source, formed by condensing of the light beam from said light source by means of said rotationally symmetrical mirror; multiple light source forming means having an entrance plane at the position of the image of the light source re-imaged by said re-imaging optical system and adapted to form plural secondary light sources; a focusing optical system for condensing the light beams from said multiple light source forming means; and a condensing optical system for condensing the light beam from said focusing optical system in order to uniformly illuminate the illuminated object:

wherein said re-imaging optical system is so constructed as to form the image of the reflecting surface of said rotationally symmetrical mirror on a predetermined plane of said multiple light source forming means.

The present invention is based on correcting the image of the curved reflecting surface of the rotationally symmetrical mirror into a planar form, and placing the entrance or exit plane of the multiple light source forming means at the position of the planar image of said reflecting surface, thereby forming plural secondary light source images constituting an annular secondary light source intensity distribution.

In an embodiment of the illuminating optical apparatus of the present invention, the collimating optical system forms the image of the reflecting surface of the rotationally symmetrical mirror on a predetermined plane of the multiple light source forming means, whereby an annular secondary light source intensity distribution is formed by the involvement of said multiple light source forming means.

Also in another embodiment, the re-imaging optical system forms the image of the reflecting surface of the rotationally symmetrical mirror on a predetermined plane of the multiple light source forming means, whereby an annular secondary light source intensity distribution is formed by the involvement of said multiple light source forming means.

These configurations can achieve annular illumination without light loss in principle, and can also achieve special oblique illumination, in combination with a diaphragm having two or four apertures, with a significantly improved illumination efficiency.

In particular, the present invention, if applied to the exposure apparatus for semiconductor device production, enables transfer of finer patterns onto the wafer with a very high throughput, since the reticle, constituting the illuminated object, can be subjected to uniform oblique illuminating with a significantly improved illumination efficiency.

Besides, the present invention can provide significant advantages by adding minor improvements to the already existing conventional apparatus.

Still another embodiment of the illuminating optical apparatus of the present invention comprises a light source providing a light beam; rotationally symmetrical reflection means having a non-reflecting area of a predetermined shape; light source image forming means for forming a light source image of a predetermined shape utilizing the light beam from said reflection means; and condenser means for condensing the light beam from the light source image of said predetermined shape, in order to uniformly illuminate the object of illumination:

wherein said light source image forming means includes a condensing optical system for forming the image of the reflecting surface of said reflection means on a predetermined plane in said light source image forming means.

Thus, the present invention can form plural secondary light source images constituting a secondary light source intensity distribution of annular shape, by correcting the image of the curved reflecting surface of the rotationally symmetrical mirror into a planar form and placing a predetermined plane of the multiple light source forming means at the position of said planar image of the reflecting surface.

Such configuration can achieve annular illumination without light loss in theory, and can also achieve special oblique illumination, in combination with a diaphragm having two or four apertures, with a significantly improved illumination efficiency.

Still another embodiment of the illuminating optical apparatus of the present invention comprises a light source providing a light beam; rotationally symmetrical reflection means having a non-reflecting area of a predetermined shape; light source image forming means for forming the image of said non-reflecting area utilizing the light beam from said reflection means and forming a light source image of a predetermined shape based on the light beam from said image of the non-reflecting area; and condenser means for condensing the light beam from said light source image of the predetermined shape, for uniformly illuminating the object of illumination:

wherein said light source image forming means is capable of varying the imaging state of said image of the non-reflecting area.

Thus, the present invention can switch the ordinary illumination and the oblique illumination under a very high illumination efficiency, by rendering variable the imaging state of the image of the rotationally symmetrical reflecting surface formed in the illuminating optical apparatus.

In particular, the present invention, if applied to the exposure apparatus for semiconductor device production, enables to select the ordinary illumination and the oblique illumination in a single apparatus, with a high illumination efficiency.

Still other objects of the present invention, and the features thereof, will become fully apparent from the following description of the preferred embodiments.

BRIEF DESCRIPTION OF THE DRAWINGS

FIG. 10A is a view of a 3rd embodiment of the present invention, in a state of oblique illumination;

DESCRIPTION OF THE PREFERRED EMBODIMENTS

Now the present invention will be clarified in detail by preferred embodiments thereof shown in the attached drawings.

Figure 1:
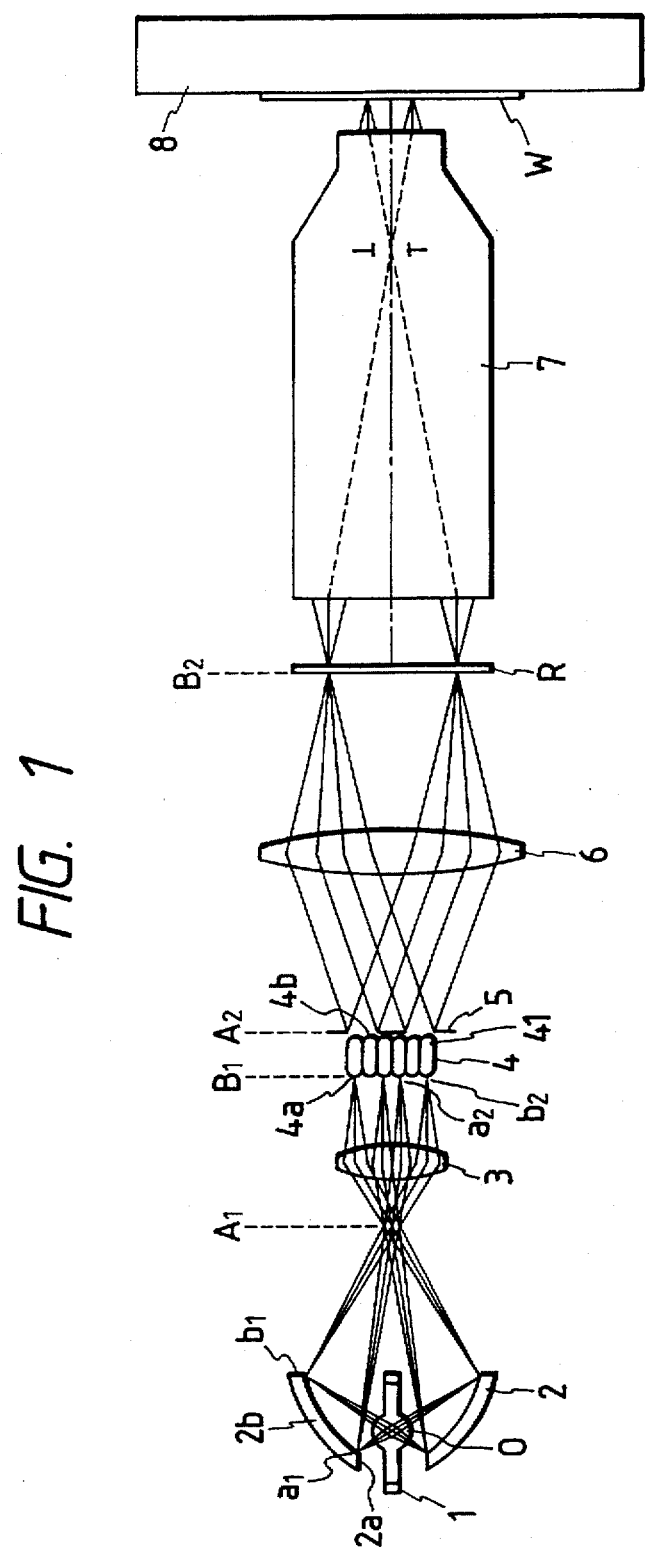
FIG. 1 is a view of a 1st embodiment of the present invention.
Figure 12:
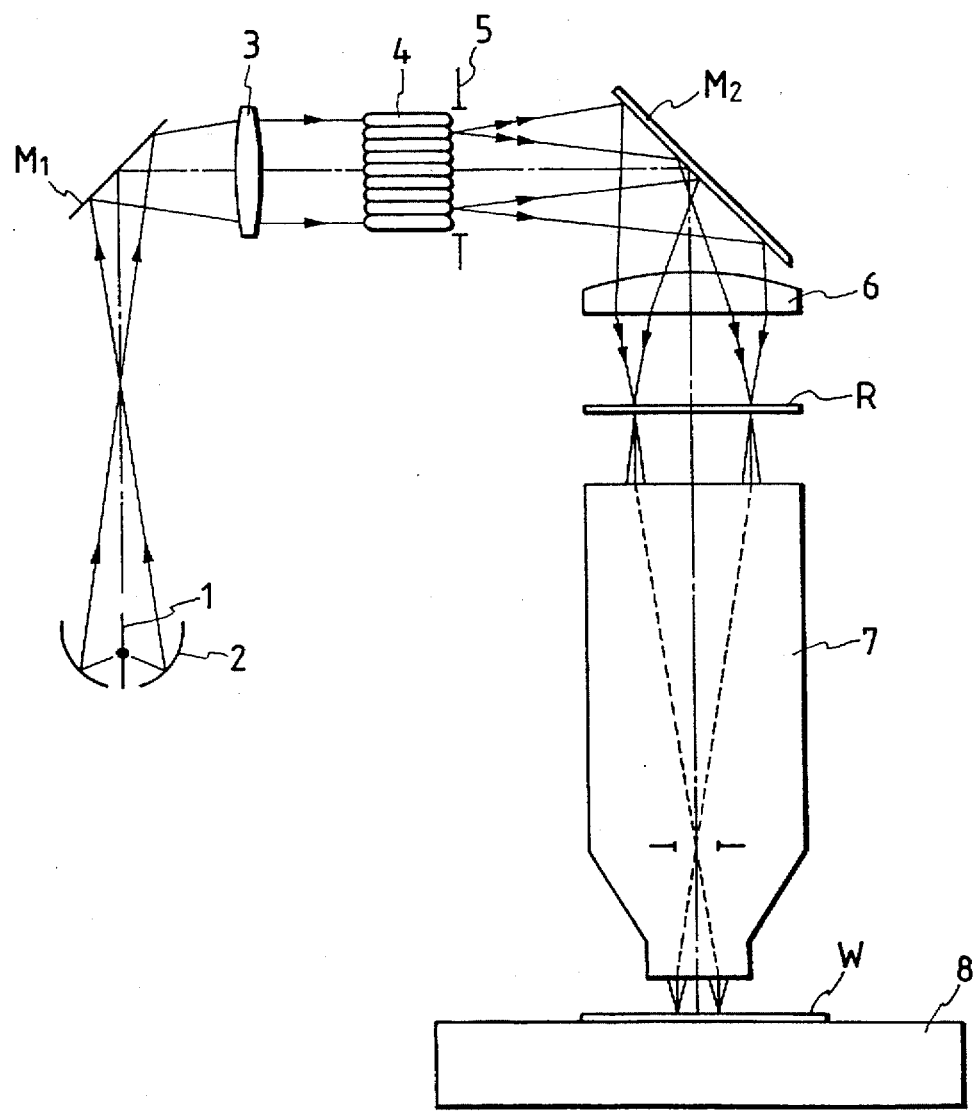
FIG. 12 is a view of a conventional apparatus.

FIG. 1 illustrates a 1st embodiment of the illuminating optical apparatus of the present invention, applied to an exposure apparatus for semiconductor device manufacture, wherein components equivalent to those in FIG. 12 are represented by same numbers. In the following, the 1st embodiment will be described in detail, with reference to FIG. 1.

A light source 1, such as a mercury arc lamp emitting the light of g-line (436 nm) or i-line (365 nm), is provided substantially at the 1st focal point O of an elliptical mirror 2, constituting a rotationally symmetrical mirror. The light beam from said light source 1 is reflected and condensed by the elliptical mirror 2, having a circular aperture 2a (first opening) and an elliptical reflecting surface 2b, whereby an image of the light source 1 is formed at the 2nd focal point A1 of the elliptical mirror 2.

Figure 2:
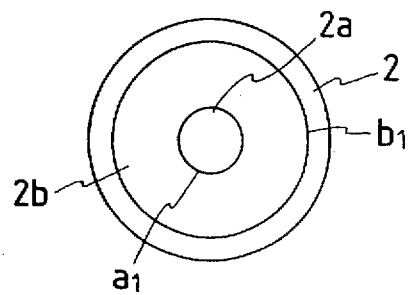
FIG. 2 is a view of an elliptical mirror, seen from the side of the 2nd focal point.

FIG. 2 illustrates the elliptical mirror 2, seen from the side of the 2nd focal point thereof, wherein the reflecting areas at a reflecting position a1 in the vicinity of the aperture 2a shown in FIG. 1 and at a reflecting position b1 (second opening) farthest from the aperture 2a are both ring-shaped. The aperture 2a of the elliptical mirror 2 may also be non-circularly shaped.

The light beam, forming the image of the light source at said 2nd focal point A1 under the condensing function of the elliptical mirror 2, is converted into a parallel light beam by a collimating lens 3 constituting a collimating optical system and so provided that the front focal point is positioned at said image position A1 of the light source, and said parallel light beam enters a fly's eye lens 4 (optical integrator) functioning as multiple light source forming means.

Figure 3:
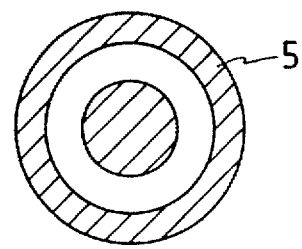
FIG. 3 is a plan view of a diaphragm having an annular aperture.

Said fly's eye lens 4 is composed of a cluster of a plurality of lens elements 41 having circular or polygonal (square, hexagonal etc.) cross section. The parallel light beam, upon passing said fly's eye lens, forms plural images of the light source at the exit plane or at a position A2 in the vicinity thereof, whereby a secondary light source is substantially formed at said position. At said secondary light source position A2, there is provided a diaphragm 5 having an annular aperture as shown in FIG. 3. In the present embodiment, each lens element 41 is formed as a biconvex lens, but it may also have a flat or concave face at a side or may be formed as a biconcave lens. Also the fly's eye lens 4 may be constructed as a doughnut-shaped cluster.

Figure 4:
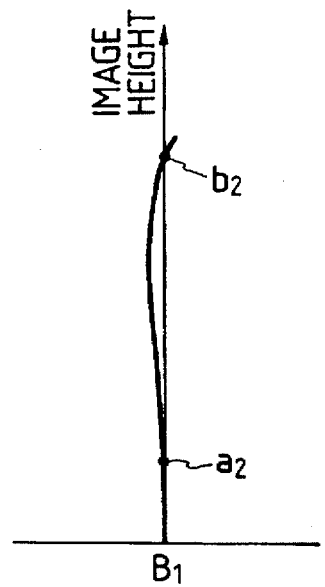
FIG. 4 is a view showing the image position of the reflecting surface of the elliptical mirror, formed by the collimating lens of a 1st embodiment.

The collimating lens 3 has a correcting function of flattening the image of the reflecting surface 2b of the elliptical mirror 2, by focusing the reflected light beam from an annular reflecting area a1 in the vicinity of the aperture of the elliptical mirror 2 onto a position a2 slightly distant from the center of the entrance plane 4a of the fly's eye lens 4 and focusing the reflected light beam from a peripheral annular reflecting area b1, farthest from the aperture 2a of the elliptical mirror 2, onto a peripheral position b2 of the entrance plane 4a of the fly's eye lens 4. Consequently, as shown in FIG. 4, the image of the entire reflecting surface 2b of the elliptical mirror 2 is formed by the collimating lens 3, as a substantially flat image, on the entrance plane 4a of the fly's eye lens 4.

Figure 5A:
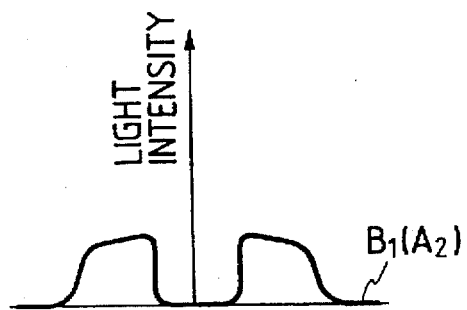
FIG. 5A is a chart showing the light intensity distribution of the entrance plane of the fly's eye lens, where the image of the reflecting surface of the elliptical mirror is formed by the collimating lens of the 1st embodiment.

As a result, the light intensity distribution on the entrance plane of the fly's eye lens becomes hollow at the center, having the light intensity only at the peripheral part as shown in FIG. 5A. Thus, the plural secondary light sources, formed at the exit side position A2 of the fly's eye lens 4, constitute a light intensity distribution hollow at the center and having the light intensity substantially in the peripheral area only, as shown in FIG. 5A. Consequently, at the exit side position A2 of the fly's eye lens, there is formed an annular secondary light source, with a size matching the annular aperture of the diaphragm 5.

Figure 5B:
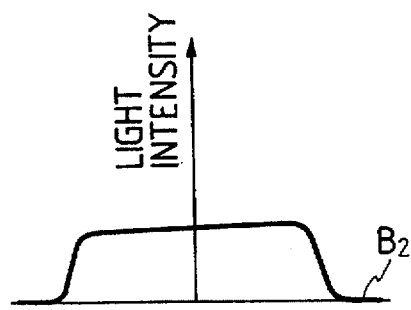
FIG. 5B is a chart showing the light intensity distribution on the reticle.

The light beams from said annular secondary light source pass the diaphragm 5, then are condensed by a condenser lens 6 constituting a condenser optical system, and obliquely illuminate, in superposed manner, a reticle R constituting the object of illumination. In this state, the light intensity distribution on the reticle R becomes uniform as shown in FIG. 5B, so that the reticle R is illuminated in uniform manner.

The reticle R is supported by an unrepresented reticle stage, while the wafer W, constituting an object of projection, is placed on a two-dimensionally movable wafer stage 8, in such a manner that said reticle R and wafer W become mutually conjugate with respect to a projection optical system 7. By uniform illumination of the reticle R, the circuit pattern formed thereon is projected onto the wafer W in reduced manner by the projection optical system 7, whereby the image of the circuit pattern is transferred onto the wafer 7.

As explained in the foregoing, the 1st embodiment can directly form a secondary light source intensity distribution of annular shape without any interception of the light beam, thereby achieving the annular illumination with an extremely high illumination efficiency. It is thus rendered possible to transfer finer patterns onto the wafer W, with a larger depth of focus, while realizing a high throughput.

Figure 6A:
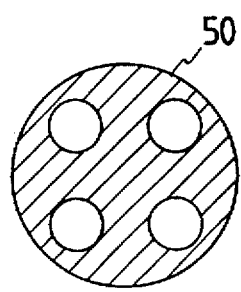
FIG. 6A is a plan view of a diaphragm having four circular apertures.
Figure 6B:
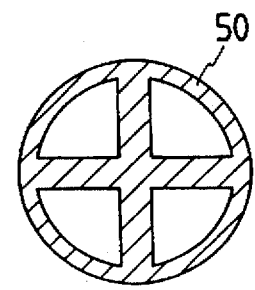
FIG. 6B is a plan view of a diaphragm having four sector-shaped apertures.

Also the diaphragm 5 having an annular aperture as shown in FIG. 3, employed in the 1st embodiment, may be replaced by a diaphragm 50 having four circular apertures as shown in FIG. 6A or a diaphragm 50 having four sector-shaped apertures as shown in FIG. 6B for achieving the special oblique illumination under an illumination efficiency significantly higher than in the prior art.

Figure 7:
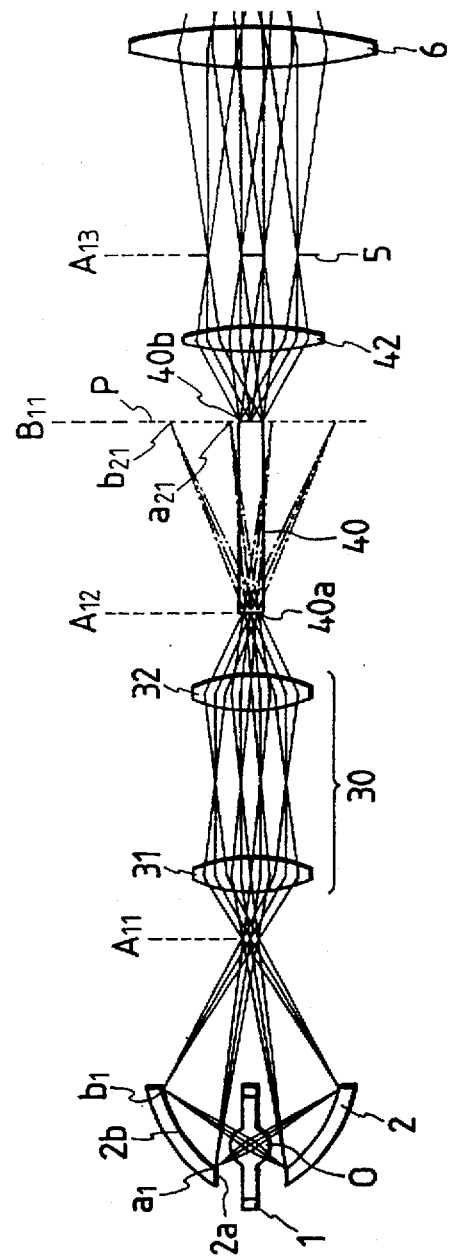
FIG. 7 is a view of a 2nd embodiment of the present invention.

In the following there will be explained a 2nd embodiment of the present invention, with reference to FIG. 7, illustrating an illuminating optical apparatus adapted for use in an exposure apparatus for semiconductor device manufacture, wherein components equivalent to those in FIG. 1 are represented by same numbers.

In the 2nd embodiment, the fly's eye lens in the 1st embodiment is replaced by a rod-shaped optical member 40, such as a glass rod (internally-reflecting prismatic optical integrator), constituting multiple light source forming means.

As shown in FIG. 7, the light beam from the light source 1 is condensed by the elliptical mirror 2, constituting a rotationally symmetrical mirror, to form an image of the light source at the 2nd focal point A11 thereof, and then enters a re-imaging optical system 30. Said re-imaging optical system 30 is composed of a 1st re-imaging lens 31 and a 2nd re-imaging lens 32. Said 1st re-imaging lens 31 is so positioned that the front focal point thereof coincides with the light source image position A11, and converts the light beam condensed by the elliptical mirror 2 into a parallel light beam. The 2nd re-imaging lens 32 condenses the parallel light beam obtained from the 1st re-imaging lens 31 to again form an image of the light source at the rear focal point A12 thereof, and guides the light beam to the rod-shaped optical member 40 constituting the multiple light source forming means.

Said rod-shaped optical member 40 is so positioned that the entrance plane 40a thereof coincides with the position A12 of the light source image re-imaged by the re-imaging optical system 30, and, by the internal reflection of said optical member 40, there are formed plural light source images (false images) at a position A12 substantially on the entrance plane 40a. Then the plural light beams formed by the rod-shaped optical member 40 are guided to a condensing lens 42 constituting a condensing optical system.

Said condensing lens 42 is so positioned that the front focal point coincides with the position B11 of the exit plane 40b of the rod-shaped optical member 40, and condenses the light beam emerging from the rod-shaped optical member 40, thereby forming plural light source images (real images) at the rear focal point of the condensing lens 42. At the position of said plural light source images (real images), there is provided a diaphragm 5 having an annular aperture as shown in FIG. 3.

Figure 8:
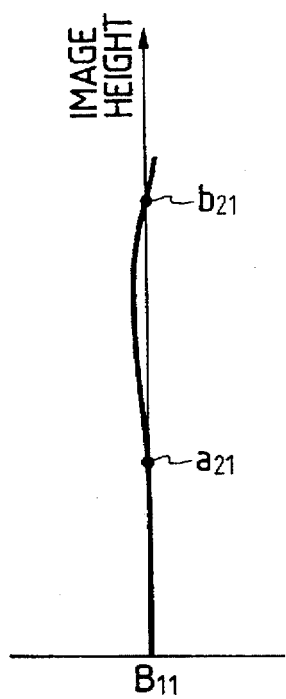
FIG. 8 is a view showing the image position of the reflecting surface of the elliptical mirror, formed by the re-imaging optical system of the 2nd embodiment.

As shown in FIG. 8 representing the image position of the reflecting surface 2b of the elliptical mirror 2, the re-imaging optical system 30 corrects the image of the reflecting surface 2b of the elliptical mirror 2, formed at the position B11 of the exit face 40b of the rod-shaped optical member 40, into a substantially flat form. For the purpose of simplicity, FIG. 8 shows the image position of the reflecting surface 2b of the elliptical mirror 2 in a state in which the light beams reflected inside the rod-shaped optical member 40 are developed, as indicated by chain-lines in FIG. 7, to focus on an imaginary plane P (along the exit plane 40b of the rod-shaped optical member), but the actual image position of the reflecting surface 2b of the elliptical mirror in the axial direction, from the interior to the exit plane of the rod-shaped optical member 40, is the same as the chain-lined developed state shown in FIG. 7.

In the present embodiment, as shown in FIG. 7, the correcting function for flattening the image of the reflecting surface 2b of the elliptical mirror 2 is principally performed by the 1st re-imaging lens 31, but said function may also be principally performed by the 2nd re-imaging lens 32, or shared by both re-imaging lenses 31, 32.

Thus, as shown in FIG. 7, the re-imaging optical system 30 focuses the reflected light beam from an annular reflecting area a1 in the vicinity of the aperture 2a of the elliptical mirror 2 into a position a21 slightly distant from the center of the exit plane 40b of the rod-shaped optical member 40, and also focuses the reflected light beam from a peripheral annular reflecting area b1 farthest from the aperture 2a of the elliptical mirror 2 onto a peripheral position b21 of the exit plane 40b of the said rod-shaped optical member 40, whereby the image of the entire reflecting surface 2b of the elliptical mirror 2 is formed, in substantially flat manner, on the entrance plane 40a of the rod-shaped optical member 40.

Figure 9A:
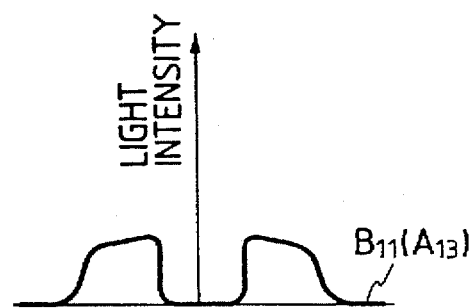
FIG. 9A is a chart showing the light intensity distribution on the exit plane of the rod-shaped optical member, where the image of the reflecting surface of the elliptical mirror is formed by the re-imaging optical system of the 2nd embodiment.

As a result, the light intensity distribution on the exit plane of the re-imaging optical system becomes hollow at the center, having light intensity only in the peripheral area, as shown in FIG. 9A. Consequently the secondary light sources (real images) re-formed at a position A13 by the cooperation of the rod-shaped optical member 40 and the condensing lens 42 constitute a light intensity distribution hollow at the center and having light intensity substantially at the peripheral area only as shown in FIG. 9A. Thus there is formed an annular secondary light source with a size matching the annular aperture of the diaphragm 5.

Figure 9B:
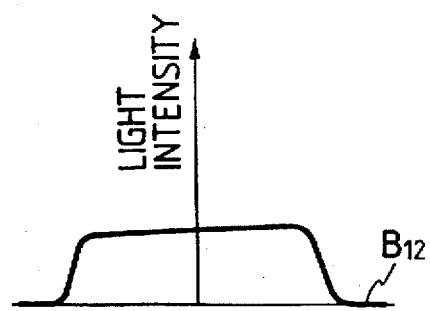
FIG. 9B is a chart showing the light intensity distribution on the reticle.

The light beams from said secondary light source pass the diaphragm 5, then are condensed by a condenser lens 6 and obliquely illuminate, in superposed manner, the reticle R constituting the object of illumination. The light intensity distribution on the reticle R in this state becomes uniform as shown in FIG. 9B, so that the reticle R is illuminated in uniform manner.

Thus, in a similar manner to the 1st embodiment, the 2nd embodiment can form an annular secondary light source without any interception of the light beam, thereby achieving the annular illumination with an extremely high illumination efficiency. Consequently the apparatus of the 2nd embodiment, if applied to the exposure apparatus for semiconductor device production as shown in FIG. 1, enables transfer of finer patterns onto the wafer W, with a larger depth of focus, while realizing a high throughput.

Also in the 2nd embodiment, the diaphragm 5 having an annular aperture as shown in FIG. 3 may be replaced by a diaphragm 50 having four circular apertures as shown in FIG. 6A or having four sector-shaped apertures as shown in FIG. 6B, for achieving the special oblique illumination with an illumination efficiency higher than in the prior art. Also the rod-shaped optical member 40 in the 2nd embodiment is not limited to a glass rod, but may be composed, for example, of a hollow rod-shaped optical member designed for internal reflection.

In the following, there will be explained a 3rd embodiment of the present invention, with reference to FIGS. 10A and 10B, which illustrate an illuminating optical apparatus adapted for use in the exposure apparatus for semiconductor device manufacture. In said 3rd embodiment, for switching the illuminating method for the reticle R, the diaphragm 5 of the 1st embodiment shown in FIG. 1 is replaced by a turret plate 51 having plural diaphragms, and collimating lenses 3a, 3b are interchangeably provided, in cooperation with the shapes of the plural diaphragms. Said collimating lens 3a has optical characteristics similar to those of the collimating lens 3 in the 1st embodiment.

Figure 10B:
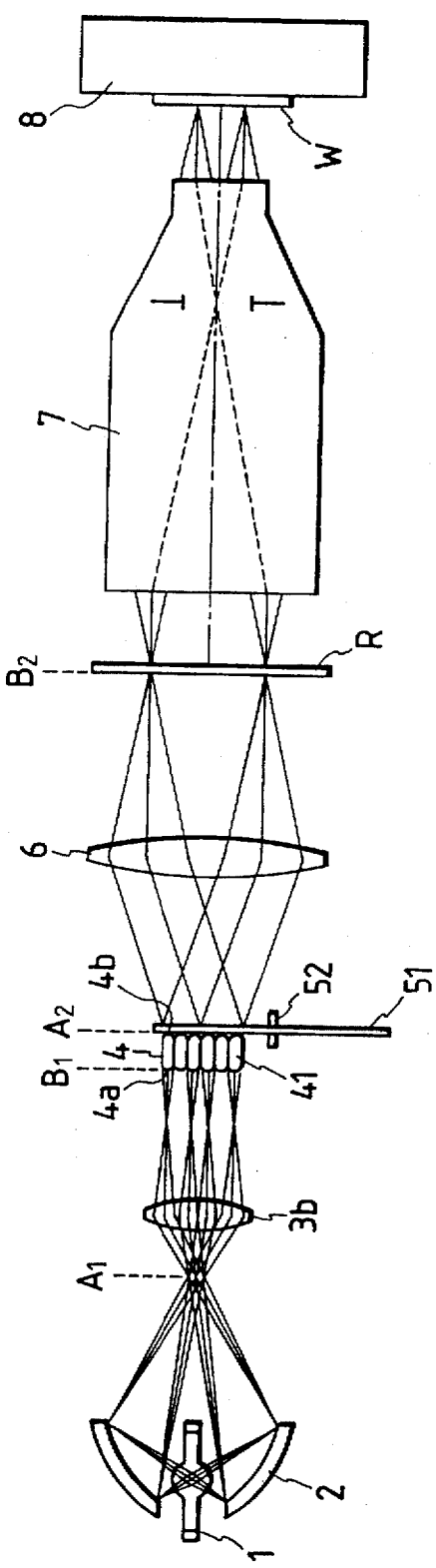
FIG. 10B is a view of the 3rd embodiment, in a state of ordinary illumination.

In FIGS. 10A and 10B, components equivalent to those in FIG. 1 are represented by same numbers, and, FIG. 10A shows a state of oblique illumination similar to that in the 1st embodiment shown in FIG. 1, while FIG. 10B shows a state of ordinary illumination as in the conventional art.

Figure 11:
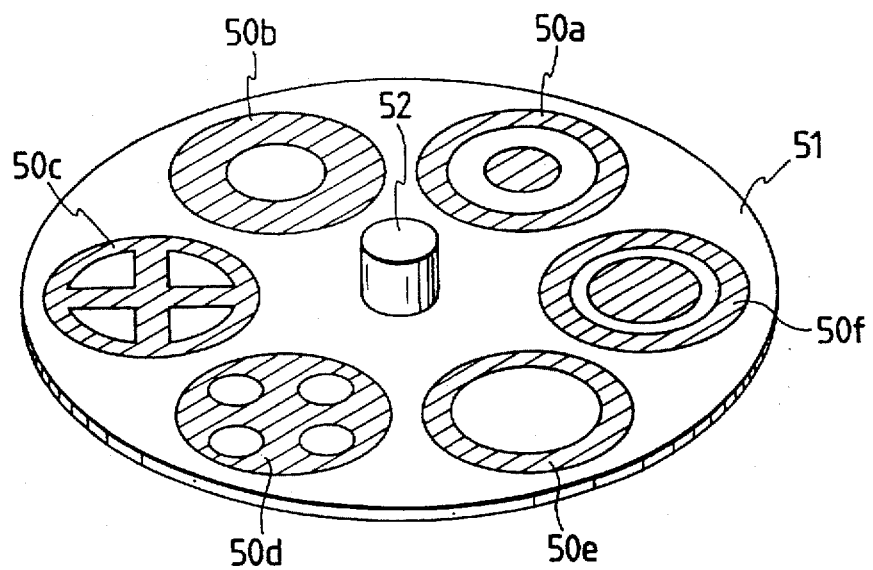
FIG. 11 is a schematic view of a turret diaphragm in the 3rd embodiment.

The turret plate 51, having plural diaphragms, is rendered rotatable, as shown in FIG. 11, about a shaft 52. As shown therein, the turret plate 51 is provided with diaphragms 50a–50f, mutually different in the shape of the apertures. The diaphragm 50a has an annular aperture; the diaphragms 50b and 50e have a circular aperture each, different in diameter; the diaphragm 50c has four sector-shaped aperture, the diaphragm 50d has four circular apertures; and the diaphragm 50f has an annular aperture different in the annular ratio (ratio of external to internal diameter of the annular aperture) from that in the diaphragm 50a.

In FIG. 10A, an input unit 13 is provided in order to enter the information concerning the illuminating method for the reticle R. In the present embodiment, there can be selected "1st annular illumination", "2nd annular illumination", "1st ordinary illumination", "2nd ordinary illumination", "1st special oblique illumination", or "2nd special oblique illumination". The selecting information is transmitted to a control unit 10, which, in response to the information from the input unit 13, controls a driving unit 11 for rotating the turret plate 51 and a lens exchange unit 12 for exchanging the collimating lenses 3a, 3b. The functions of said control unit 10 will be detailedly explained in the following.

It is assumed that the initial state is in the oblique illumination, as shown in FIG. 10A. In this state, the turret plate 51 is so positioned that the diaphragm 50a shown in FIG. 11 is placed at the position A2 of the plural light source images.

In case of switching the illumination for the reticle R to the ordinary illumination, the selecting information for the "1st ordinary illumination" or the "2nd ordinary illumination" is entered into the input unit 13. Said "1st ordinary illumination" and "2nd ordinary illumination" are different in σ-value (σ=$NA_1/NA_2$ wherein $NA_1$ is the numerical aperture of the illuminating optical system 1–6 while $NA_2$ is that of the projection optical system 7).

For example, if the selecting information for the "1st ordinary illumination" is entered into the input unit 13, the control unit 10, in response, drives the driving unit 11 to rotate the turret plate 51 in such a manner that the diaphragm 50e is placed corresponding to the position A2 of the plural light source images. Also if the selecting information for the "2nd ordinary illumination" is entered into the input unit 13, the control unit 10 in response controls the driving unit 11 in such a manner that the diaphragm 50b is placed corresponding to the position A2 of the plural light source images. Then the control unit 10 controls the lens exchange unit 12 in such a manner that the collimating lens 3b is positioned, instead of the lens 3a, in the optical path of the illuminating optical system.

Now, there will be explained the optical characteristics of the collimating lens 3b, with reference to FIG. 10B. The light beam from the light source 1 is condensed by the elliptical mirror 2 to form the image of the light source at the 2nd focal point A1 thereof, and then enters the collimating lens 3b. Said lens 3b is so provided that the front focal point thereof coincides with the position A1 of the light source image, and converts the light beam from said light source image position A1 into a parallel light beam. In this state, the image of the reflecting surface 2b of the elliptical mirror 2 is formed at a position distant from the entrance plane 4a of the fly's eye lens 4. Consequently, on the entrance plane 4a of the fly's eye lens 4, the image of the reflecting surface 2a is in a defocused state, with a light intensity distribution without the central hollow part. Thus at the exit side position A2 of the fly's eye lens 4, there are formed plural secondary light sources arranged uniformly. The light beams from said plural secondary light sources are transmitted by the diaphragm 50e on the turret plate 51, then are condensed by the condenser lens 6 and uniformly illuminate the reticle R, constituting the object of illumination, in superposed manner. The image of the reflecting surface 2b, formed by the collimating lens 3b only needs to be distant from the entrance plane 4a of the fly's eye lens 4, and said image of the reflecting surface 2b may be flat or curved.

Also in case of switching the illuminating from the ordinary illumination as shown in FIG. 10B to the oblique illumination, the input unit 13 is given the selecting information for the "1st annular illumination", "2nd annular illumination", "1st special oblique illumination" or "2nd special oblique illumination". The 1st annular illumination and the 2nd annular illumination are different in the annular ratio of the annular secondary light source, while the 1st special oblique illumination and the 2nd special oblique illumination are different in the distribution of the secondary light sources. More specifically, the secondary light sources in the "1st special oblique illumination" are distributed in four sector-shaped areas, while those in the "2nd special oblique illumination" are distributed in four circular areas.

For example, if the "1st annular illumination" is selected, the control unit 10 controls the driving unit 11 to rotate the turret plate 51 in such a manner that the diaphragm 50a is placed at the position A2 of the plural light source images. Likewise, if the "2nd annular illumination", "1st special oblique illumination" or "2nd special oblique illumination" is selected, the control unit 10 controls the driving unit 11 to rotate the turret plate 51 in such a manner that the diaphragm 50f, 50c or 50d is respectively placed at the position A2 of the plural light source images. Then the control unit 10 controls the lens exchanging unit 12 to replace the collimating lens 3b with 3a. Said collimating lens 3a forms the sub-image of the entire reflecting surface 2b of the elliptical mirror 2, in a substantially flat manner, on the entrance plane 4a of the fly's eye lens 4. Thus the fly's eye lens 4 forms a substantially annular secondary light source, whereby the oblique illumination can be achieved with a high efficiency of the light amount.

In the 3rd embodiment explained above, the illuminating method is selected through the input unit 13, but there may be provided a detection unit 14 for reading the information on the reticle R, as indicated by a broken line in FIG. 10A. In such case, the information concerning the illuminating method is recorded, for example by bar codes, in an area of the reticle R outside the circuit pattern. The detection unit 14 reads said information concerning the illuminating method, and transmits it to the control unit 10, which, in response, controls the driving unit 11 and the lens exchanging unit 12 as explained above.

As explained in the foregoing, the 3rd embodiment can improve the illumination efficiency both in the ordinary illumination and in the oblique illumination, since the optical characteristics of the collimating lens, for converting the light from the light source into the parallel light beam, are varied according to the switching between the ordinary illumination and the oblique illumination.

In the foregoing embodiments, the diaphragm is provided at the position where the annular secondary light source is formed, but, as will be easily understood from the principle of the present invention, the diaphragm is not essential in the present invention.

Also in the 3rd embodiment described above, the collimating lenses 3a, 3b of mutually different imaging characteristics are interchangeably provided, but, if each of said collimating lenses 3a, 3b is composed of plural lens components, the imaging characteristics may be varied by the movement of a part of said lens components.

In the diaphragms in the foregoing embodiments, the opaque part is assumed to completely intercept the illuminating light, but said opaque part may be so designed to have a certain transmittance. In such case, the contrast of the projected image can be improved only in predetermined fine patterns.

The foregoing embodiments have been given only for clarifying the technical aspects of the present invention. The present invention should not be construed in the narrow sense limited to such embodiments, but is subject to various modifications within the scope and spirit of the appended claims.

What is claimed is:

1. An illuminating optical apparatus comprising:

a light source providing a light beam;

a rotationally symmetrical mirror having first and second openings which are spaced along an optical axis of said illuminating optical apparatus, and a reflecting surface which extends between said first and second openings symmetrically about said optical axis and which condenses said light beam;

a collimating optical system which converts the condensed light beam into a substantially parallel light beam and which also forms an image of the entire reflecting surface substantially on a predetermined plane; and a multiple light source forming device which receives said parallel light beam and which has a predetermined surface substantially coincident with said predetermined plane, said multiple light source forming device forming plural secondary light sources from said substantially parallel light beam and from said image of the entire reflecting surface.

2. An illuminating optical apparatus according to claim 1, wherein said predetermined surface is the entrance surface of said multiple light source forming device.

3. An illuminating optical apparatus according to claim 2, wherein said multiple light source forming device includes an optical integrator.

4. An illuminating optical apparatus according to claim 3, wherein said optical integrator includes plural lens elements.

5. An illuminating optical apparatus according to claim 2, wherein said plural secondary light sources formed by said multiple light source forming device constitute an annularly shaped light intensity distribution.

6. An illuminating optical apparatus according to claim 5, wherein said multiple light source forming device includes an optical integrator that forms said secondary light sources, and further comprising a diaphragm having an aperture of a predetermined shape and positioned at the exit side of said optical integrator.

7. An illuminating optical apparatus according to claim 6, wherein said aperture is of annular shape.

8. An illuminating optical apparatus according to claim 6, wherein said diaphragm has at least two said apertures of predetermined shapes provided at positions deviated from the center of said diaphragm.

9. An illuminating optical apparatus comprising:
a light source providing a light beam;
a rotationally symmetrical mirror having first and second openings which are spaced along an optical axis of said illuminating optical apparatus, and a reflecting surface which extends between said first and second openings symmetrically about said optical axis and which condenses said light beam;
a re-imaging optical system which re-images an image of the light source formed by the condensed light beam at a predetermined position and which also forms an image of the entire reflecting surface substantially on a predetermined plane;
a multiple light source forming device which has an entrance surface substantially at said predetermined position, which also has a surface substantially coincident with said predetermined plane, and which forms plural secondary light sources;
an imaging optical system which focuses light beams from said multiple light source forming device; and
a condenser optical system which condenses light beams from said imaging optical system for uniformly illuminating an object of illumination.

10. An illuminating optical apparatus according to claim 9, wherein said predetermined surface of said multiple light source forming device is the exit surface thereof.

11. An illuminating optical apparatus according to claim 10, wherein said multiple light source forming device includes an optical integrator.

12. An illuminating optical apparatus according to claim 11, wherein said optical integrator includes a rod-shaped optical member.

13. An illuminating optical apparatus according to claim 12, wherein plural secondary light sources formed by said optical integrator constitute an annularly shaped light intensity distribution.

14. An illuminating optical apparatus according to claim 13, further comprising a diaphragm provided at a position where said plural secondary light sources are formed.

15. An illuminating optical apparatus according to claim 14, wherein said diaphragm has an aperture of annular shape.

16. An illuminating optical apparatus according to claim 14, wherein said diaphragm has at least two apertures of predetermined shapes, provided at positions deviated from the center of said diaphragm.

17. An illuminating optical apparatus comprising:
a light source providing a light beam;
a rotationally symmetrical mirror having a non-reflecting area and a light passing area which are spaced along an optical axis of said illuminating optical apparatus, and a reflecting area which extends between said non-reflecting area and said light passing area symmetrically about said optical axis and which reflects said light beam;
a light source image forming device which forms light source images based on the reflected light beam; and
a condensing optical system which condenses light beams from said light source images for uniformly illuminating an object of illumination;
wherein said light source image forming device includes an imaging optical system which forms an image of a portion of said reflecting area which is the closest to said non-reflecting area and an image of a portion of said reflecting area which is closest to said light passing area substantially on a predetermined plane at a surface of said light source image forming device.

18. An illuminating optical apparatus according to claim 17, wherein said light source image forming device includes an optical integrator which forms plural secondary light sources.

19. An illuminating optical apparatus according to claim 18, wherein said predetermined surface is the entrance surface of said optical integrator.

20. An illuminating optical apparatus according to claim 18, wherein said predetermined surface is the exit surface of said optical integrator.

21. An illuminating optical apparatus according to claim 17, wherein said non-reflecting area is an opening of said mirror.

22. An illuminating optical apparatus comprising:
a light source providing a light beam;
a rotationally symmetrical reflector having a non-reflecting area and a reflecting area which in symmetric about an optical axis and which is illuminated by said light beam;
an imaging optical system which forms an image of said non-reflecting area and an image of said reflecting area substantially on a predetermined plane;
a light source image forming device which forms light source images from the images of said non-reflecting area and said reflecting area; and
a condensing optical system which condenses light beams from said light source images for uniformly illuminating an object of illumination,
wherein said imaging optical system changes positions of said predetermined plane along the optical axis.

23. An illuminating optical apparatus according to claim 22, wherein said imaging optical system changes said positions between a first position substantially on a surface of said light source imaging forming device and a second position distant from said first position.

24. An illuminating optical apparatus according to claim 23, wherein said light source image forming device includes an optical integrator which forms plural secondary light sources.

25. An illuminating optical apparatus according to claim 24, wherein said predetermined plane is the entrance surface of said optical integrator.

26. An illuminating optical apparatus according to claim 24, wherein said predetermined plane is the exit surface of said optical integrator.

27. An illuminating optical apparatus according to claim 24, further comprising a diaphragm located at a position where said secondary light sources are formed and which has an aperture.

28. An illuminating optical apparatus according to claim 27, wherein said diaphragm transforms the shape of said aperture.

29. An illuminating optical apparatus according to claim 28, wherein said diaphragm transforms the shape of said aperture, according to the positions of said predetermined plane.

30. An illuminating optical apparatus according to claim 22, wherein said reflector forms an image of said light source and said imaging optical system converts the image of said light source into a substantially parallel light beam, and wherein said light source image forming device forms plural secondary light sources from said substantially parallel light beam.

31. An illuminating optical apparatus according to claim 22, wherein said imaging optical system includes a pair of exchangeable optical devices, one of which places said predetermined plane at a first position and the other of which places said predetermined plane at a second position distant from said first position.

32. An illuminating optical apparatus according to claim 22, further comprising a diaphragm located at a position where said light source images are formed and which has an aperture;

an input device for entering information concerning a type of illumination to illuminate said object; and a control device which controls said imaging optical system to select the position of said predetermined plane and which controls said diaphragm to change the shape of said aperture, depending upon the input information.

* * * * *